(12) United States Patent
Zhu et al.

(10) Patent No.: US 12,506,036 B2
(45) Date of Patent: Dec. 23, 2025

(54) DICING AND WAFER THINNING TO FORM SEMICONDUCTOR DIES

(71) Applicant: Sandisk Technologies, Inc., Milpitas, CA (US)

(72) Inventors: Zhengjie Zhu, Shanghai (CN); Junrong Yan, Shanghai (CN); Chee Keong Chin, Shanghai (CN); Cheng Chang, Shanghai (CN); Zhonghua Qian, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 524 days.

(21) Appl. No.: 17/838,491

(22) Filed: Jun. 13, 2022

(65) Prior Publication Data

US 2023/0402323 A1 Dec. 14, 2023

(51) Int. Cl.
*H01L 21/78* (2006.01)
*H01L 21/683* (2006.01)

(52) U.S. Cl.
CPC .......... *H01L 21/78* (2013.01); *H01L 21/6836* (2013.01); *H01L 2221/68327* (2013.01)

(58) Field of Classification Search
CPC ................. H01L 21/78; H01L 21/6836; H01L 2221/68327; H01L 2221/6834
See application file for complete search history.

(56) References Cited

U.S. PATENT DOCUMENTS

| | | | | |
|---|---|---|---|---|
| 10,903,119 B2* | 1/2021 | Otto | ........................ | H01L 33/20 |
| 2007/0181988 A1* | 8/2007 | Han | ........................ | H01L 24/13 |
| | | | | 257/E23.129 |
| 2008/0012119 A1* | 1/2008 | Otremba | .................. | H01L 21/78 |
| | | | | 257/734 |
| 2010/0155940 A1* | 6/2010 | Kawashita | .......... | H01L 25/0657 |
| | | | | 257/737 |
| 2010/0207227 A1* | 8/2010 | Meyer-Berg | .......... | H01L 21/568 |
| | | | | 257/E31.117 |
| 2012/0119389 A1* | 5/2012 | Menath | .................... | H01L 21/78 |
| | | | | 257/782 |
| 2013/0157414 A1* | 6/2013 | Ho | .......................... | H01L 25/50 |
| | | | | 257/E21.599 |
| 2017/0015548 A1* | 1/2017 | Mao | ..................... | B81C 1/00333 |
| 2020/0058510 A1* | 2/2020 | Yamada | .............. | H01L 21/3043 |

\* cited by examiner

*Primary Examiner* — Norman D Richards
*Assistant Examiner* — Sean Ayers Winters
(74) *Attorney, Agent, or Firm* — Patterson + Sheridan, LLP

(57) ABSTRACT

A semiconductor die is separated from a semiconductor wafer using a method that involves performing a partial cut on the semiconductor wafer, applying tape lamination to a front side of the semiconductor wafer, grinding a back side of the semiconductor wafer, mounting the semiconductor wafer to a die attach film (DAF) layer, removing the tape lamination from the front side of the semiconductor wafer, and performing a DAF-die separation operation to separate the semiconductor die from the adjacent semiconductor die. A DAF laser is not used during the method of separating a semiconductor die from a semiconductor wafer. The front side is the side of the semiconductor wafer where integrated circuits are exposed. The partial cut is between the semiconductor die and an adjacent semiconductor die. The back side is opposite of the front side and the back side is a silicon layer of the semiconductor die.

7 Claims, 9 Drawing Sheets

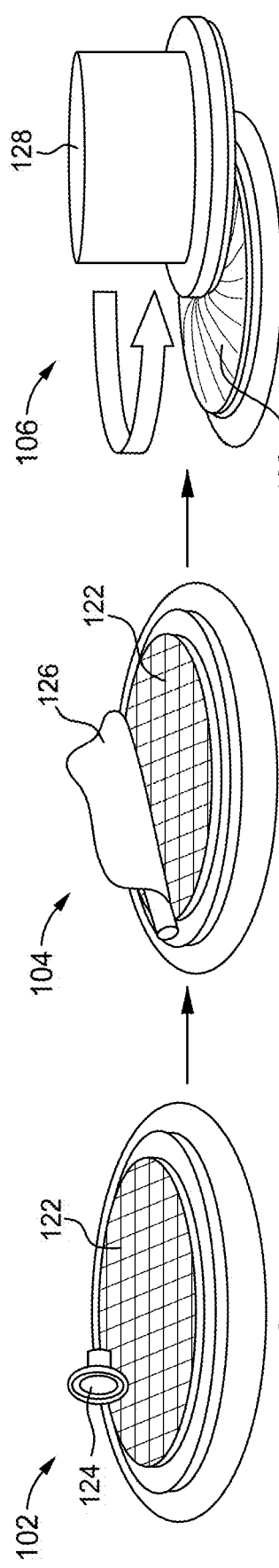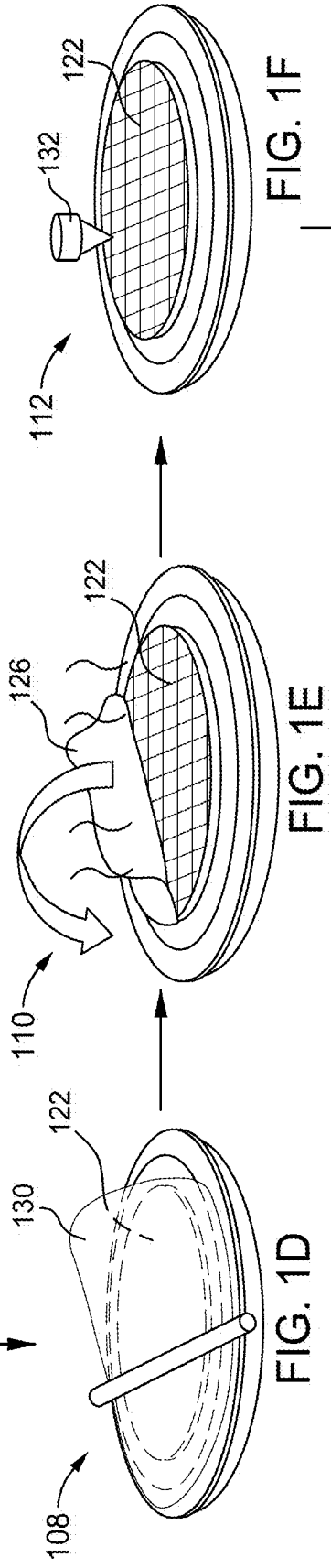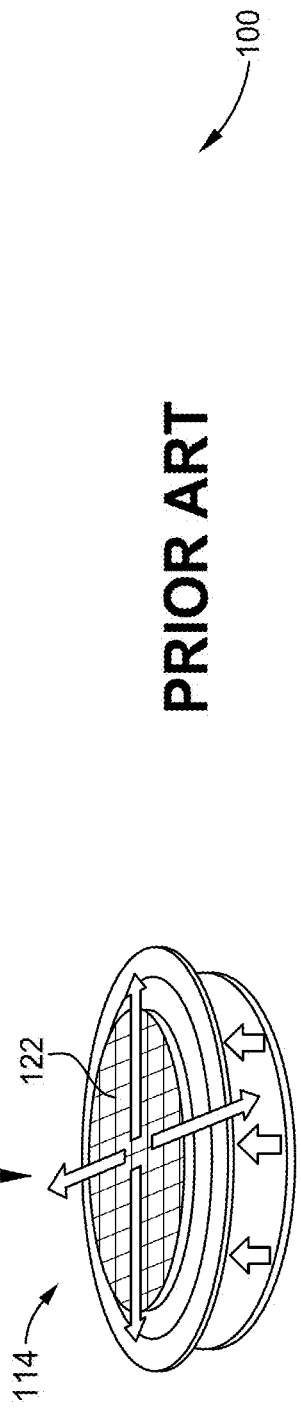

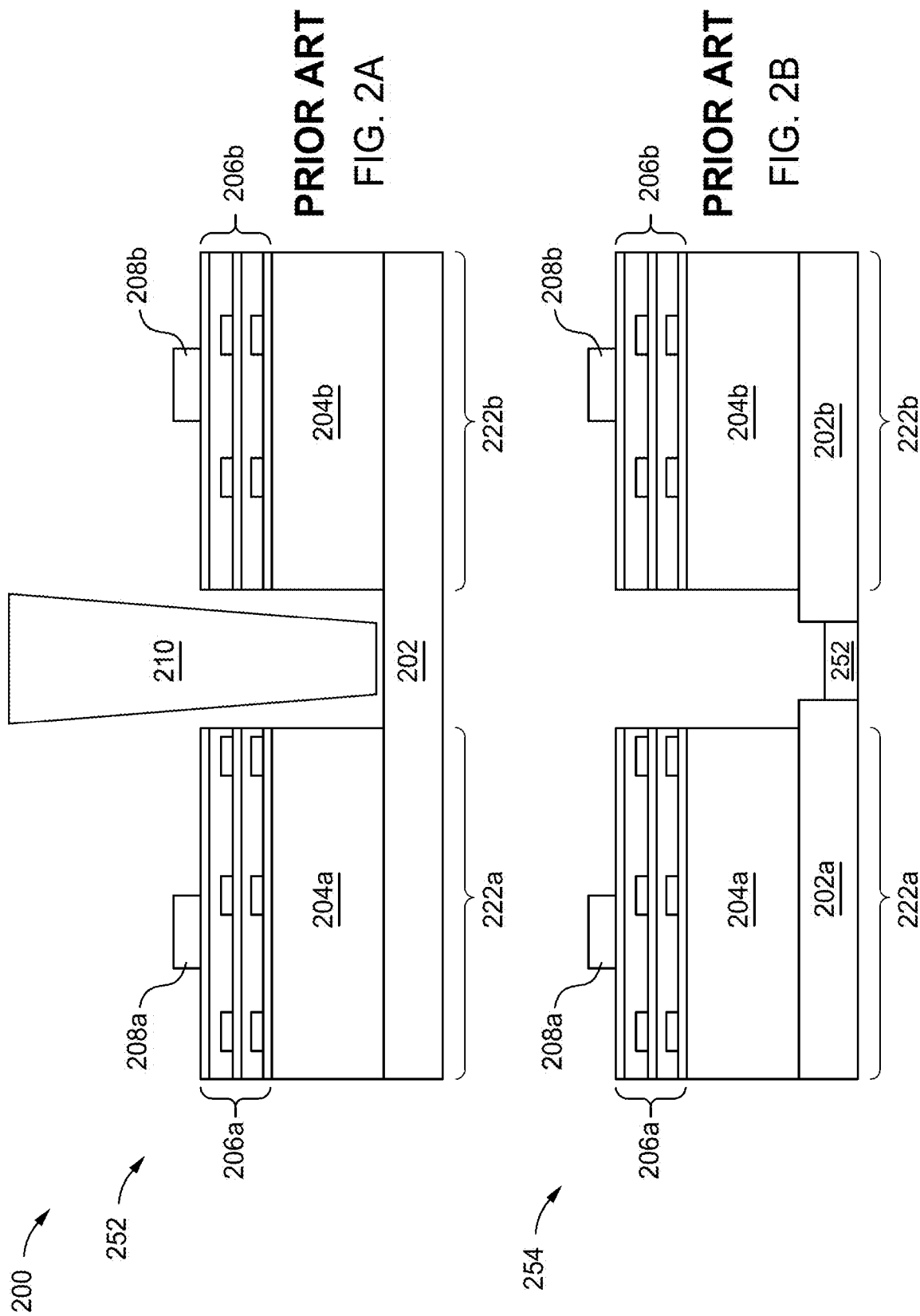

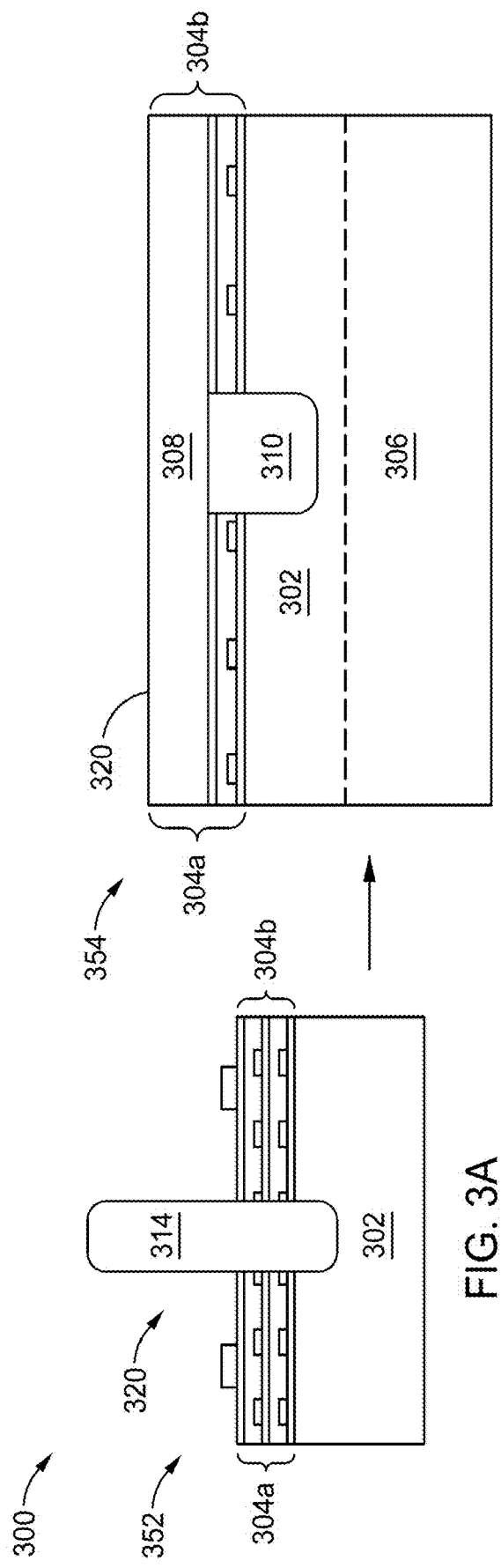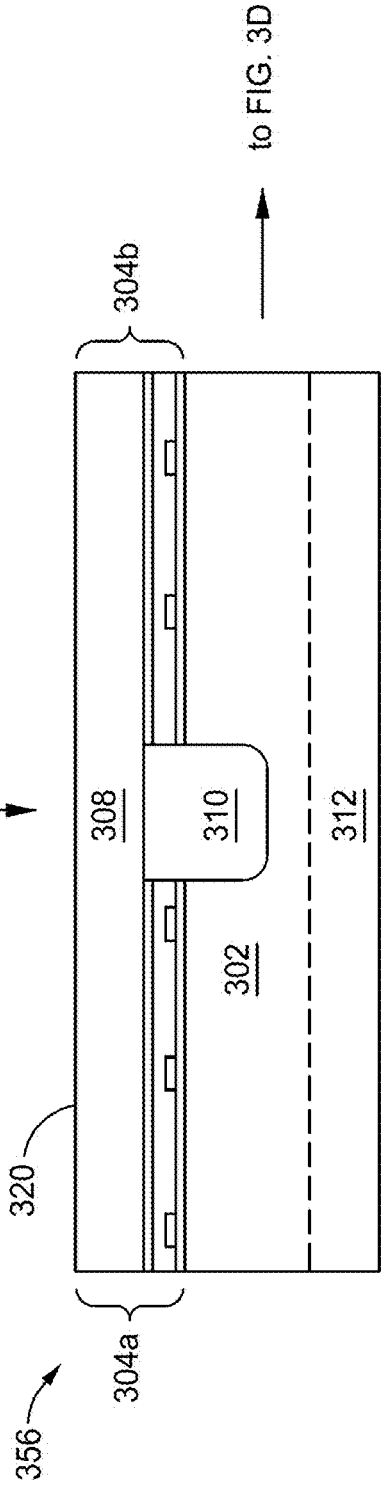

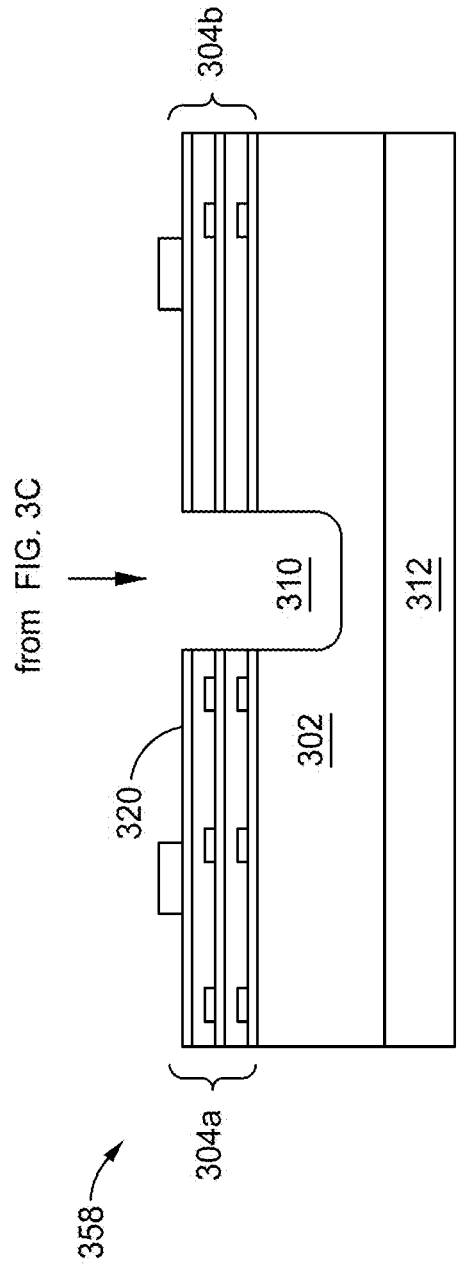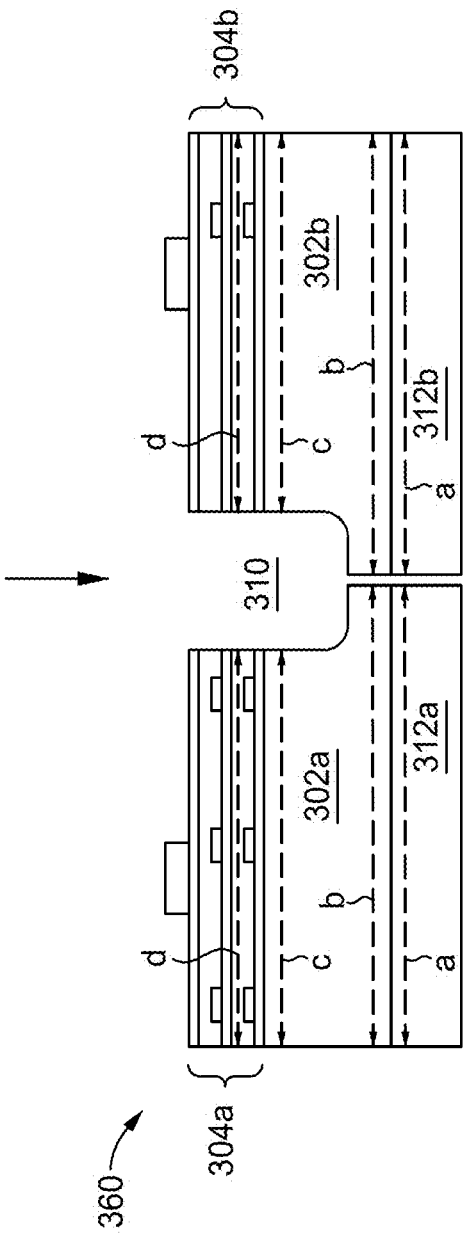

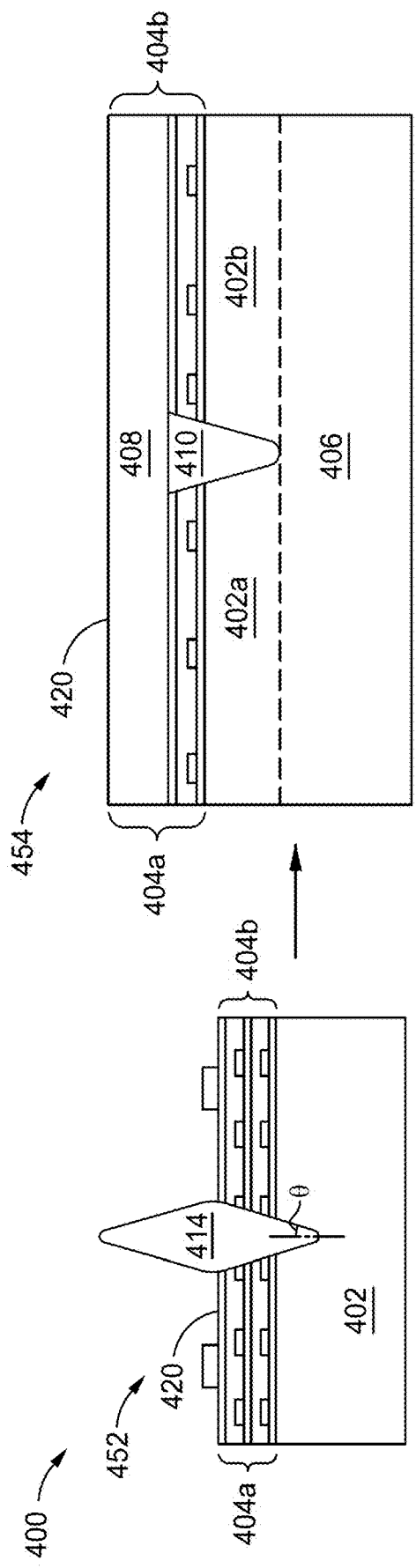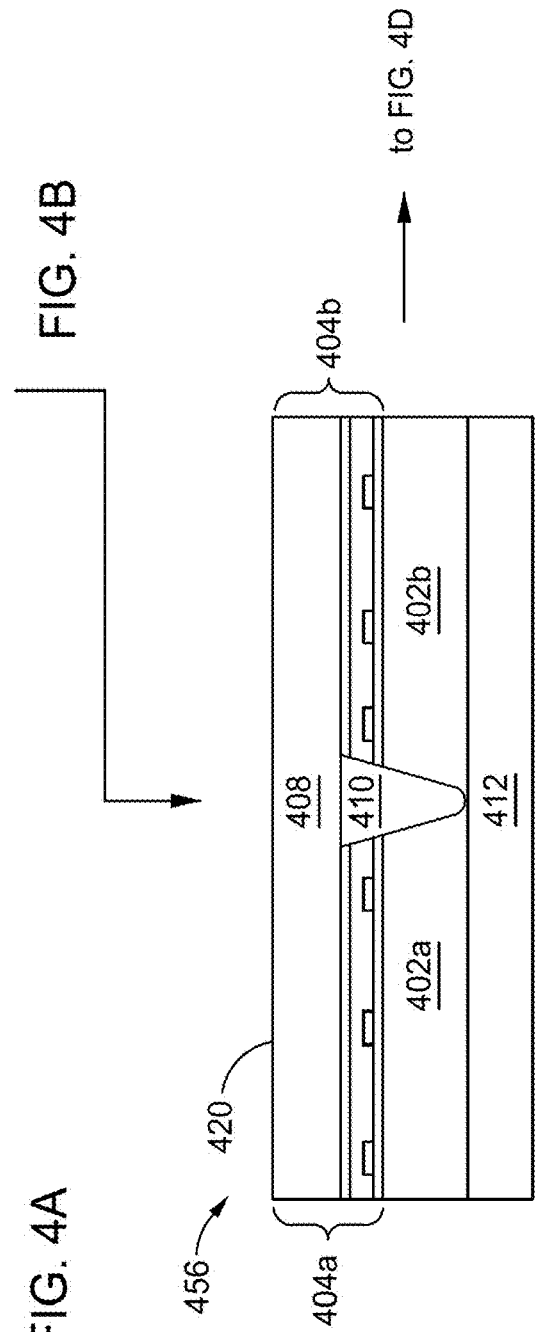

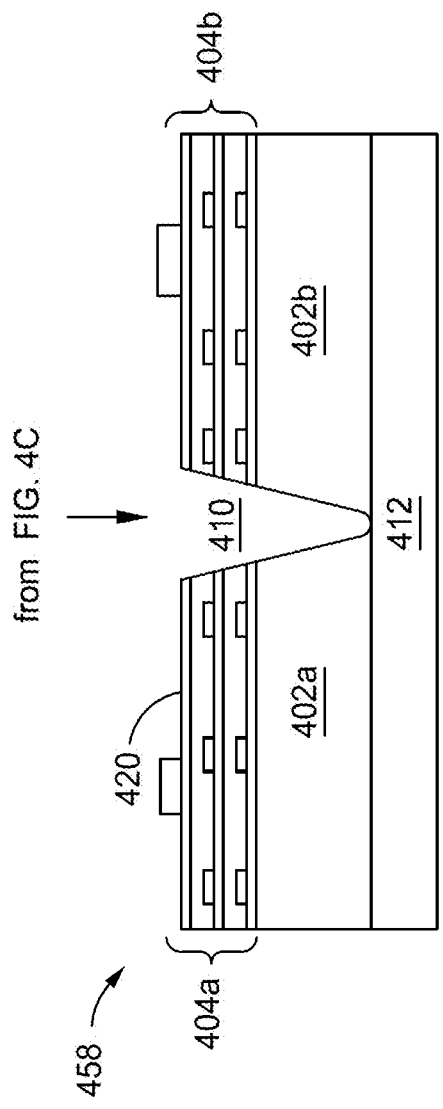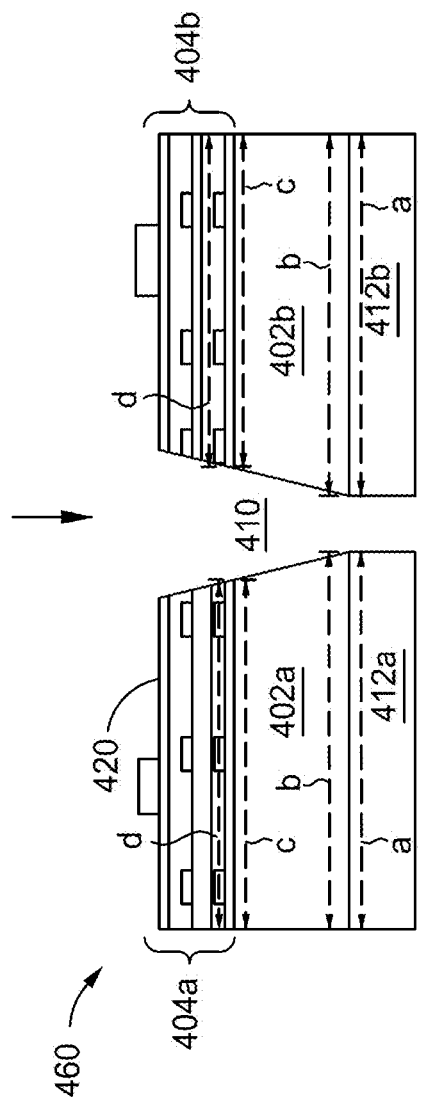

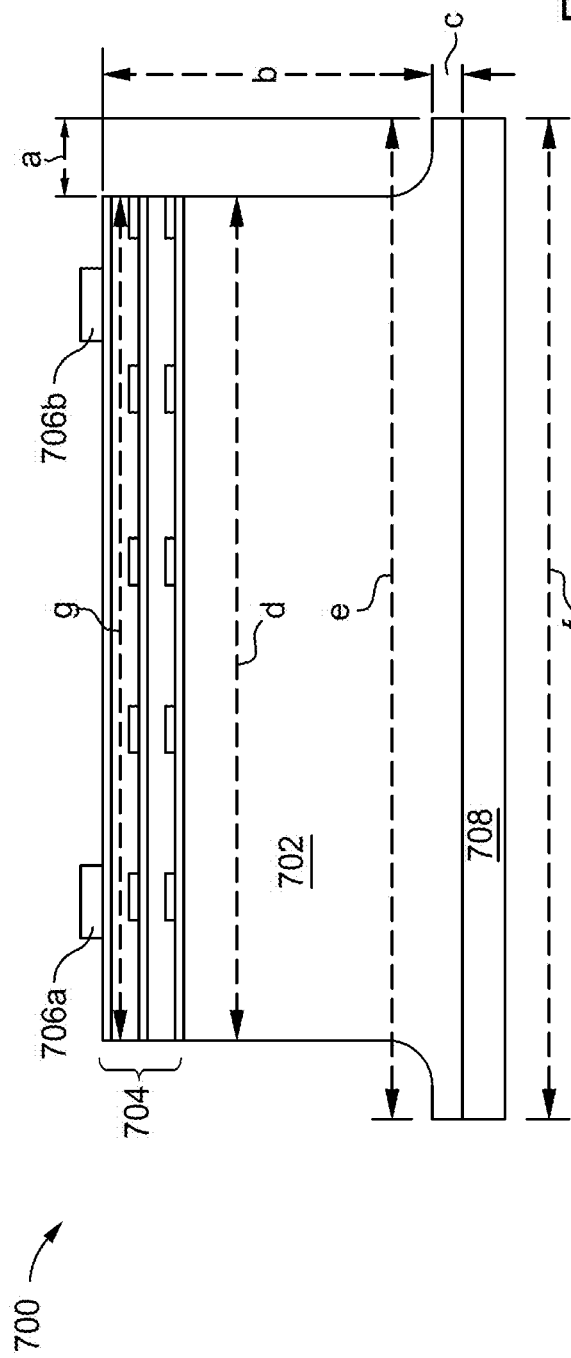
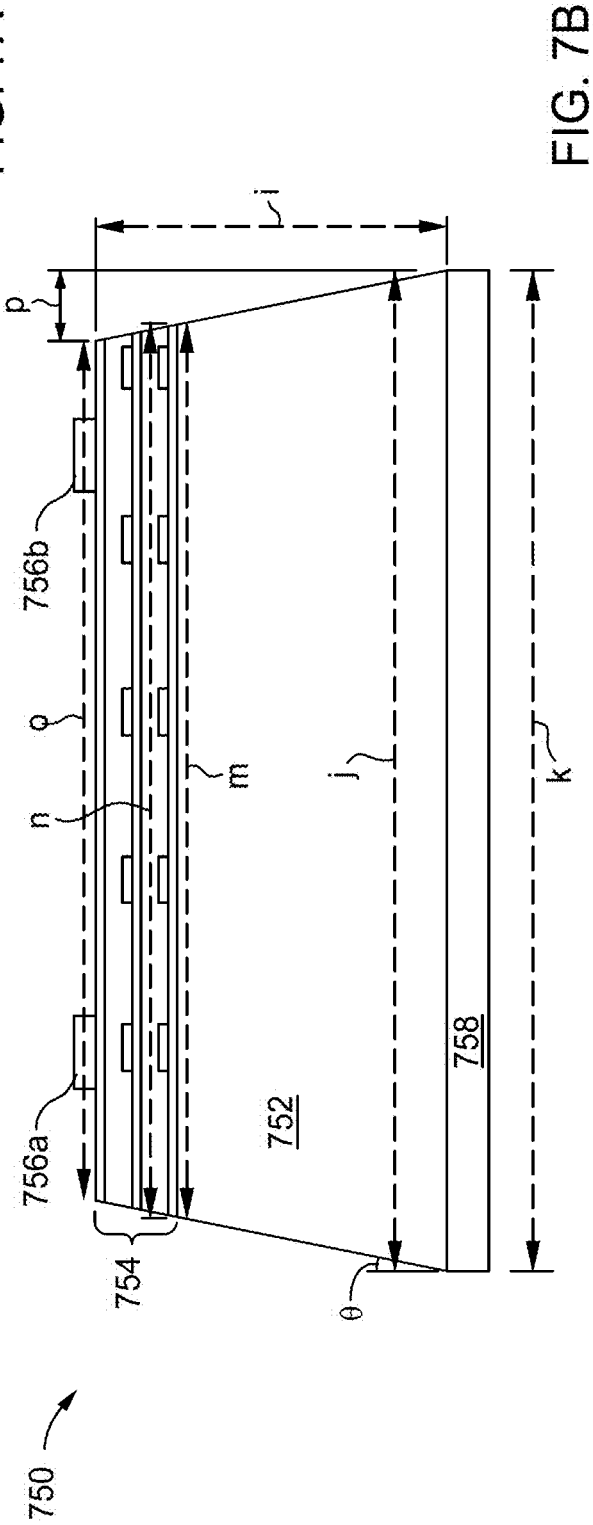

DICING AND WAFER THINNING TO FORM SEMICONDUCTOR DIES

BACKGROUND OF THE DISCLOSURE

Field of the Disclosure

Embodiments of the present disclosure generally relate to methods of separating a semiconductor die from a semiconductor wafer having a plurality of semiconductor dies.

Description of the Related Art

In the semiconductor industry, the demand for smaller semiconductor packages has increased the need for advancements in semiconductor package miniaturization. The demand may be due to the industry providing more compact or densely formed integrated circuits. As thinner dies are needed for package miniaturization, the complexity of producing the thinner semiconductor dies becomes greater. Furthermore, thinner semiconductor dies may be more susceptible to mechanical defects, such as fracturing or shift cuts. Therefore, during manufacturing of the thinner semiconductor dies, maintaining quality and not decreasing yield while producing thinner dies is greatly appreciated.

When a wafer is received from a foundry, the dies on the wafer are thinned with a back grinding process. Prior to back grinding, an adhesive tape is placed over a front surface of the wafer to protect the dies. After back grinding, a Die Attach Film (DAF) is disposed on the wafer backside and a DAF laser process and a DAF-die separation (DDS) process are performed to separate the dies from each other. The DAF laser process assists in preventing burrs along the edges where the wafer is cut to form the individual dies as well as preventing random fractures from occurring during the DDS process. However, the cost to purchase and maintain the laser can be quite high. Additionally, the DAF laser process may result in shift cuts. Shift cuts occur when adjacent dies are out of alignment from the back grinding process such that the laser will cut the out-of-alignment die, which reduces yield.

Therefore, there is a need in the art for a less expensive yet improved die preparation process.

SUMMARY OF THE DISCLOSURE

The present disclosure generally relates to a die separation process including methods of dicing and wafer thinning to form semiconductor dies from a semiconductor wafer having a plurality of semiconductor dies. A semiconductor die is separated from a semiconductor wafer using a method that involves performing a partial cut on the semiconductor wafer, applying tape lamination to a front side of the semiconductor wafer, grinding a back side of the semiconductor wafer, mounting the semiconductor wafer to a die attach film (DAF) layer, removing the tape lamination from the front side of the semiconductor wafer, and performing a DAF-die separation operation to separate the semiconductor die from the adjacent semiconductor dies. A DAF laser is not used during the method of separating a semiconductor die from a semiconductor wafer. The front side is the side of the semiconductor wafer where integrated circuits are exposed. The partial cut is between the semiconductor die and an adjacent semiconductor die. The back side is opposite of the front side and the back side is a silicon layer of the semiconductor die.

Certain terms are used herein to describe a wafer upon which integrated circuit dies are formed. The terms top side, active side, or front side means the lateral side where the active sides of the integrated circuits are exposed, and the term back side is the side opposite the front side or active side. The back side is a silicon portion of the wafer/dies.

In one embodiment, a method of separating a semiconductor die from a semiconductor wafer having a plurality of semiconductor dies, the method includes performing a partial cut on a front side of the semiconductor wafer to a first level of the semiconductor wafer to form a cavity, applying tape lamination on the front side of the semiconductor wafer, grinding a silicon layer on a back side of the semiconductor wafer, mounting the back side of the semiconductor wafer to a die attach film (DAF) layer, removing the tape lamination from the front side of the semiconductor wafer, and performing a DAF-die separation (DDS) process to separate the semiconductor die from an adjacent semiconductor die of the semiconductor wafer. Remnants of the DAF layer may remain on a side edge of the semiconductor die. The side edge of the semiconductor die has a width that is greater than a remaining portion of the semiconductor die. A width of the remnants of the DAF layer is equal to the width of the side edge of the semiconductor die. The grinding is to a second level of the semiconductor wafer and the back side is opposite the front side.

In another embodiment, a semiconductor die structure formed by a method including a step for performing a partial cut on a front side of the semiconductor wafer to a first level of the semiconductor wafer to form a cavity, a step for applying tape lamination on a front side of the semiconductor wafer, a step for grinding a silicon layer on a back side of the semiconductor wafer, a step for mounting the back side of the semiconductor wafer to a die attach film (DAF) layer, a step for removing the tape lamination from the front side of the semiconductor wafer, and a step for performing DAF-die separation (DDS) to separate the semiconductor die from an adjacent semiconductor die of the plurality of semiconductor dies. The grinding is to a second level of the semiconductor wafer. The back side is opposite of the front side. The first level is substantially equal to or substantially less than the second level.

In another embodiment, a semiconductor die structure separated from a semiconductor wafer having a plurality of semiconductor dies includes a die attach film (DAF) layer having a first width, a silicon layer disposed adjacent to the DAF layer, wherein a first side of the silicon layer is in contact with the DAF layer, and a metal layer disposed adjacent to the silicon layer. A second side of the silicon layer is in contact with the metal layer. The first side of the silicon layer and the second side of the silicon layer are opposite sides of the silicon layer. The silicon layer has at least a second width and a third width. The first width is substantially equal to the second width. The second width is substantially greater than the third width. The second width is a width of the first side of the silicon layer. The third width is a width of the second side of the silicon layer. Remnants of the DAF layer remain on a side edge of the semiconductor die. The side edge of the semiconductor die intersects the first side of the silicon layer and the second side of the silicon layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1A-1G illustrates an example of a conventional method of forming a semiconductor die from a semiconductor wafer having a plurality of semiconductor dies.

FIGS. 2A-2B illustrates an example of a method of forming a semiconductor die from a semiconductor wafer having a plurality of semiconductor dies using a die attach film (DAF) laser, according to the conventional method of FIGS. 1A-1G.

FIGS. 3A-3E illustrates an example of a method of forming a semiconductor die from a semiconductor wafer having a plurality of semiconductor dies, according to certain embodiments.

FIGS. 4A-4E illustrates an example of a method of forming a semiconductor die from a semiconductor wafer having a plurality of semiconductor dies, according to certain embodiments.

FIGS. 7A and 7B are exemplary illustrations of a semiconductor die, according to certain embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 5:
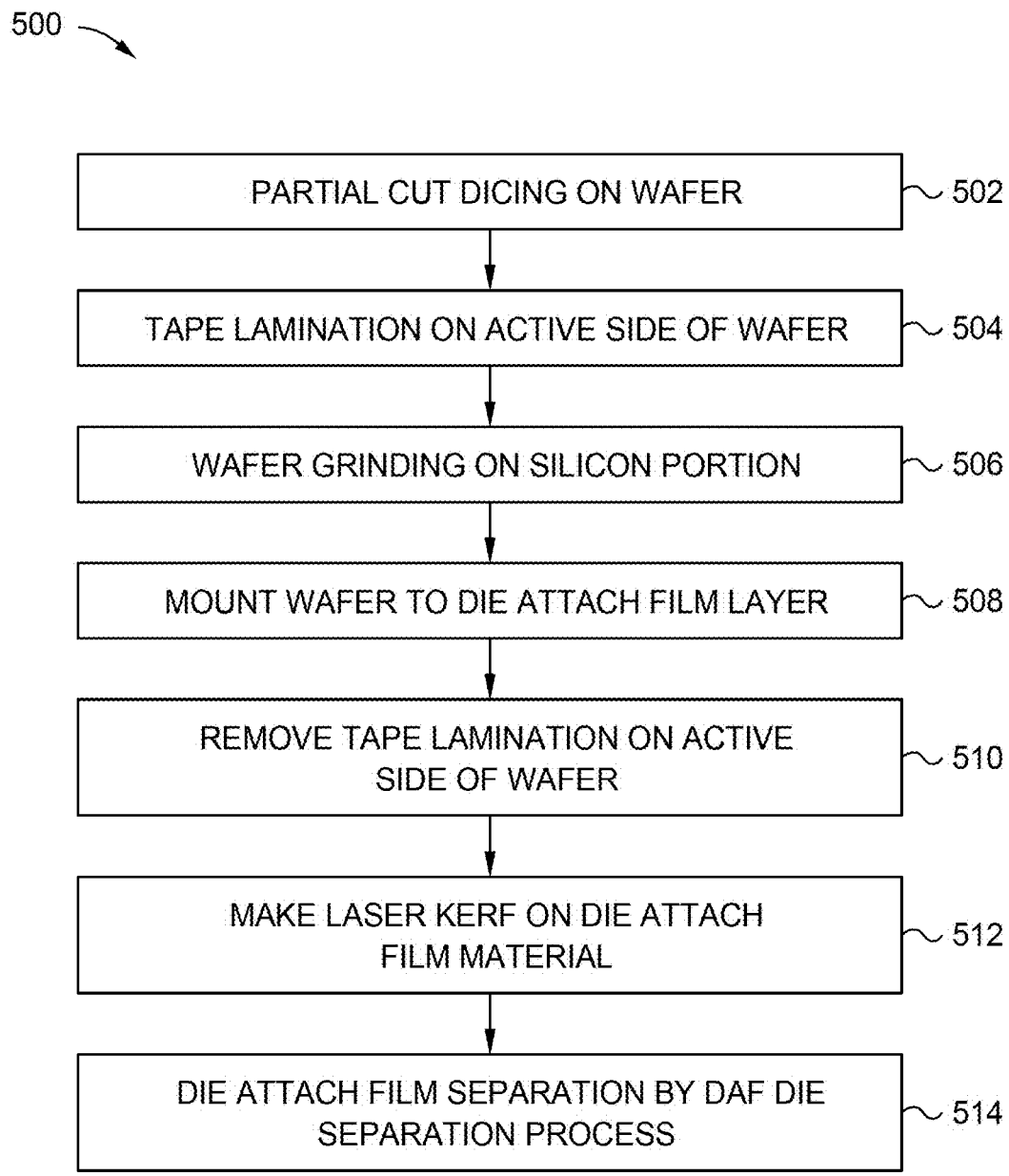
FIG. 5 is a flow diagram illustrating a conventional method of forming a semiconductor die from a semiconductor wafer having a plurality of semiconductor dies.

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a die separation process including methods of dicing and wafer thinning to form semiconductor dies from a semiconductor wafer having a plurality of semiconductor dies. A semiconductor die is separated from a semiconductor wafer using a method that involves performing a partial cut on the semiconductor wafer, applying tape lamination to a front side of the semiconductor wafer, grinding a back side of the semiconductor wafer, mounting the semiconductor wafer to a die attach film (DAF) layer, removing the tape lamination from the front side of the semiconductor wafer, and performing a DAF-die separation operation to separate the semiconductor die from the adjacent semiconductor die. A DAF laser is not used during the method of separating a semiconductor die from a semiconductor wafer. The front side is the side of the semiconductor wafer where integrated circuits are exposed. The partial cut is between the semiconductor die and an adjacent semiconductor die. The back side is opposite of the front side and the back side is a silicon layer of the semiconductor die.

FIGS. 1A-1G illustrates a conventional method 100 of forming a semiconductor die from a semiconductor wafer having a plurality of semiconductor dies, according to prior art. Conventional method 100 illustrates a die before grinding (DBG) process with a DAF laser process to separate a semiconductor die from a semiconductor wafer having a plurality of semiconductor dies. FIGS. 1A-1G shows a semiconductor wafer 122, a blade 124, a back grinding tape 126, a back grinding module 128, a DAF layer 130, and a DAF laser 132. The blade 104 may have different blade types (i.e., cutting edges). For example, the blade 104 may have a rectangular cross-section with rounded edges.

Referring to FIG. 1A, at step 102, the blade 104 is used for wafer half cut, which may be a partial cut operation, on a front side of the semiconductor wafer 122. The front side may be a metal layer of the semiconductor wafer 122, where the semiconductor wafer 122 includes the metal layer disposed on a silicon layer. The wafer half cut may be similar to wafer grooving. Referring to FIG. 1B, at step 104, the back grinding tape 126 is applied to the front side of the semiconductor wafer 122. The back grinding tape 126 may be used for cushioning protection during back grinding as well as protecting the front side of the semiconductor wafer 122 from water or liquids during back grinding. Referring to FIG. 1C, at step 106, the back grinding module 128 grinds the silicon layer of the semiconductor wafer 122 to a desired final wafer thickness. Referring to FIG. 1D, at step 108, the DAF layer 130 is applied to the silicon layer of the semiconductor wafer 122.

Referring to FIG. 1E, at step 110, the back grinding tape 126 is removed from the front side of the semiconductor wafer 122. Referring to FIG. 1F, at step 112, the DAF laser 132 is applied to the DAF layer 130 from the front side of the semiconductor wafer 122. The DAF laser 132 is used to make cuts in the DAF layer 130 to separate the individual semiconductor dies from the semiconductor wafer 122. Referring to FIG. 1G, at step 114, the DAF layer 130 is separated using a DAF-die separation (DDS) operation, which results in separating the semiconductor wafer 122 into separate semiconductor dies. The DDS operation includes expanding the DAF layer 130. The DAF layer 130 and the semiconductor wafer 122 are separated by performing tape expansion (cool expansion) during a cool-expansion stage. Then, expansion is performed again on the DAF layer 130 and the semiconductor wafer 122 during a heater expansion stage to maintain the kerf. The DAF layer 130 sag generated at the circumference of the tape is eliminated by applying a heat of 200 degrees Celsius or higher and shrinking the tape. By applying the heat, the kerf width after separation is maintained. It is to be understood that the above-described DDS operation may be a simplified description for exemplary purposes.

FIGS. 2A-2B illustrates an example of a method 200 of forming a semiconductor die from a semiconductor wafer having a plurality of semiconductor dies using a die attach film (DAF) laser 210, according to the conventional method 100 of FIG. 1A-1G. Method 200 may resemble the DAF laser application at step 112 of FIG. 1. Referring to both FIGS. 2A and 2B, the semiconductor wafer 220 includes a first semiconductor die 222a and a second semiconductor die 222b. The first semiconductor die 222a and the second semiconductor die 222b are each disposed on a DAF layer 202. The first semiconductor die 222a and the second semiconductor die 222b each includes a silicon layer 204a, 204b, respectively, a metal layer 206a, 206b, respectively, and a seal ring 208a, 208b, respectively. It is to be understood that the number of layers depicted in the metal layer and the number of seal rings is not intended to be limiting.

Referring to FIG. 2A, at step 252, the DAF laser 210 is applied to the DAF layer 202 in order to remove a portion of the DAF layer 202. The portion of the DAF layer 202 removed may be the portion that the DAF laser 202 is in contact with. Referring to FIG. 2B, at step 254, the DAF laser 210 has removed the portion of the DAF layer 202 that was in contact with the DAF laser 210. Thus, the first semiconductor die 222a and the second semiconductor die 222b are separated from each other using the DAF laser 210.

FIGS. 3A-3E illustrates an example of a method 300 of separating a semiconductor die 322a, 322b from a semiconductor wafer 320 having a plurality of semiconductor dies, according to certain embodiments. Furthermore, method 300 may not include a DAF laser cutting step. Referring to FIG. 3A, method 300 begins at step 352, where a blade 314 cuts into the semiconductor wafer 320 as part of the wafer half cut operation. The semiconductor wafer 320 includes a silicon layer 302 and a metal layer 304a, 304b. The blade 314 may have a rectangular cross-section with rounded edges. Furthermore, the blade 314 cuts through the metal layer 304a, 304b and the silicon layer 302 to a first depth to form a cavity 310. Referring to FIG. 3B, at step 354, a back grinding tape 308 is applied to the front side of the semiconductor wafer 320 (i.e., the metal layer 304a, 304b). The back grinding tape 308 protects the front side of the semiconductor wafer 320 during the back grinding process. The back grinding process removes a thickness of the silicon layer 302, where the removed thickness is to a second depth relative to the front side. The removed silicon layer may be referred to as the removed silicon layer 306. The difference between the first depth and the second depth relative to the front side may be about 10 μm.

At step 356, a DAF layer 312 is applied to the silicon layer 302, where the removed silicon layer 306 was originally. Thus, the DAF layer 312 may be separated from the cavity 310 formed by the wafer half cut operation by about 10 μm. At step 358, the back grinding tape 308 is removed from the front side of the semiconductor wafer 320. At step 360, the semiconductor wafer 320 is split into a first semiconductor die 322a and a second semiconductor die 322b by a DDS process. The DDS process may split the semiconductor wafer 320 at a midpoint of the cavity 310. Thus, remnants of the DAF layer may be located on a side of the resulting semiconductor die.

Furthermore, a width of at least a portion of the silicon layer 302a, 302b (labeled "b") is equal to a respective width of the DAF layer 312a, 312b (labeled "a"). Likewise, a width of the metal layer 304a, 304b (labeled "d") may be substantially equal to a width of a portion of the silicon layer 302a, 302b (labeled "c"), that is not equal to a respective width of the DAF layer 312a, 312b (labeled "a"). The width of the metal layer 304a, 304 (labeled "d") may be smaller than the width of the at least a portion of the silicon layer 302a, 302b (labeled "b") that is equal to a respective width of the DAF layer 312a, 312b (labeled "a").

FIGS. 4A-4E illustrates an example of a method 400 of separating a semiconductor die 422a, 422b from a semiconductor wafer 420 having a plurality of semiconductor dies, according to certain embodiments. Furthermore, method 400 may not include a DAF laser cutting step. Method 400 begins at step 452, where a blade 414 cuts into the semiconductor wafer 420 as part of the wafer half cut operation. The semiconductor wafer 420 includes a silicon layer 402 and a metal layer 404a, 404b. The blade 414 may have a diamond cross-section, where the blade 414 cuts the semiconductor wafer 420 at about a 30 degree angle from the vertical axis (0). It is to be understood that 0 may be between about 30 degrees and about 44.57 degrees from the vertical axis. Furthermore, the blade 414 cuts through the metal layer 404a, 404b and the silicon layer 302 to a first depth to form a cavity 410.

At step 454, a back grinding tape 408 is applied to the front side of the semiconductor wafer 420 (i.e., the metal layer 404a, 404b). The back grinding tape 408 protects the front side of the semiconductor wafer 420 during the back grinding process. The back grinding process removes a thickness of the silicon layer 402, where the removed thickness is to a second depth relative to the front side. The removed silicon layer may be referred to as the removed silicon layer 406. The first depth and the second depth relative to the front side may be substantially equal to each other, such that the semiconductor wafer 420 is separated into a first semiconductor chip and a second semiconductor chip.

At step 456, a DAF layer 412 is applied to the silicon layer 402, where the removed silicon layer 406 was originally. Thus, the DAF layer 412 may be in contact with the cavity 410 formed by the wafer half cut operation. At step 458, the back grinding tape 408 is removed from the front side of the semiconductor wafer 420. At step 460, the semiconductor wafer 420 is split into a first semiconductor die 422a and a second semiconductor die 422b by a DDS process. The DDS process may split the semiconductor wafer 420 at a midpoint of the cavity 410. Thus, remnants of the DAF layer may be located on a side of the resulting semiconductor die.

Furthermore, a width of at least a portion of the silicon layer 402a, 402b (labeled "b") is equal to a respective width of the DAF layer 412a, 412b (labeled "a"). Likewise, a width of the metal layer 404a, 404b (labeled "d") may be substantially equal to a width of a portion of the silicon layer 402a, 402b (labeled "c"), that is not equal to a respective width of the DAF layer 412a, 412b (labeled "a"). The width of the metal layer 404a, 404 (labeled "d") may be smaller than the width of the at least a portion of the silicon layer 402a, 402b (labeled "b") that is equal to a respective width of the DAF layer 412a, 412b (labeled "a").

FIG. 5 is a flow diagram illustrating a conventional method 500 of forming a semiconductor die from a semiconductor wafer, such as the semiconductor wafer 122 of FIG. 1, having a plurality of semiconductor dies, according to prior art. Conventional method 500 may be similar to conventional method 100 of FIG. 1. At block 502, a blade is used on a semiconductor wafer to perform partial cut dicing to a first level of the semiconductor wafer. At block 504, a back grinding tape is adhered to the front side of the conductor wafer. At block 506, a silicon layer of the semiconductor wafer is grinded using a DBG process to a second level relative to the front side of the semiconductor wafer. The first level may be greater than the second level, such that when performing the die back grinding process, the semiconductor wafer is effectively split into two or more segments.

At block 508, the semiconductor wafer is mounted to a DAF layer, where the silicon layer that was removed as part of the DBG process is replaced with the DAF layer. At block 510, the back grinding tape is removed from the front side of the semiconductor wafer. At block 512, a DAF laser is used to make a kerf on the DAF layer. For example, the kerf may resemble the semiconductor wafer 220 of FIG. 2 at step 254. At block 514, the DAF layer is separated by a DDS process to form two or more semiconductor dies.

Figure 6:
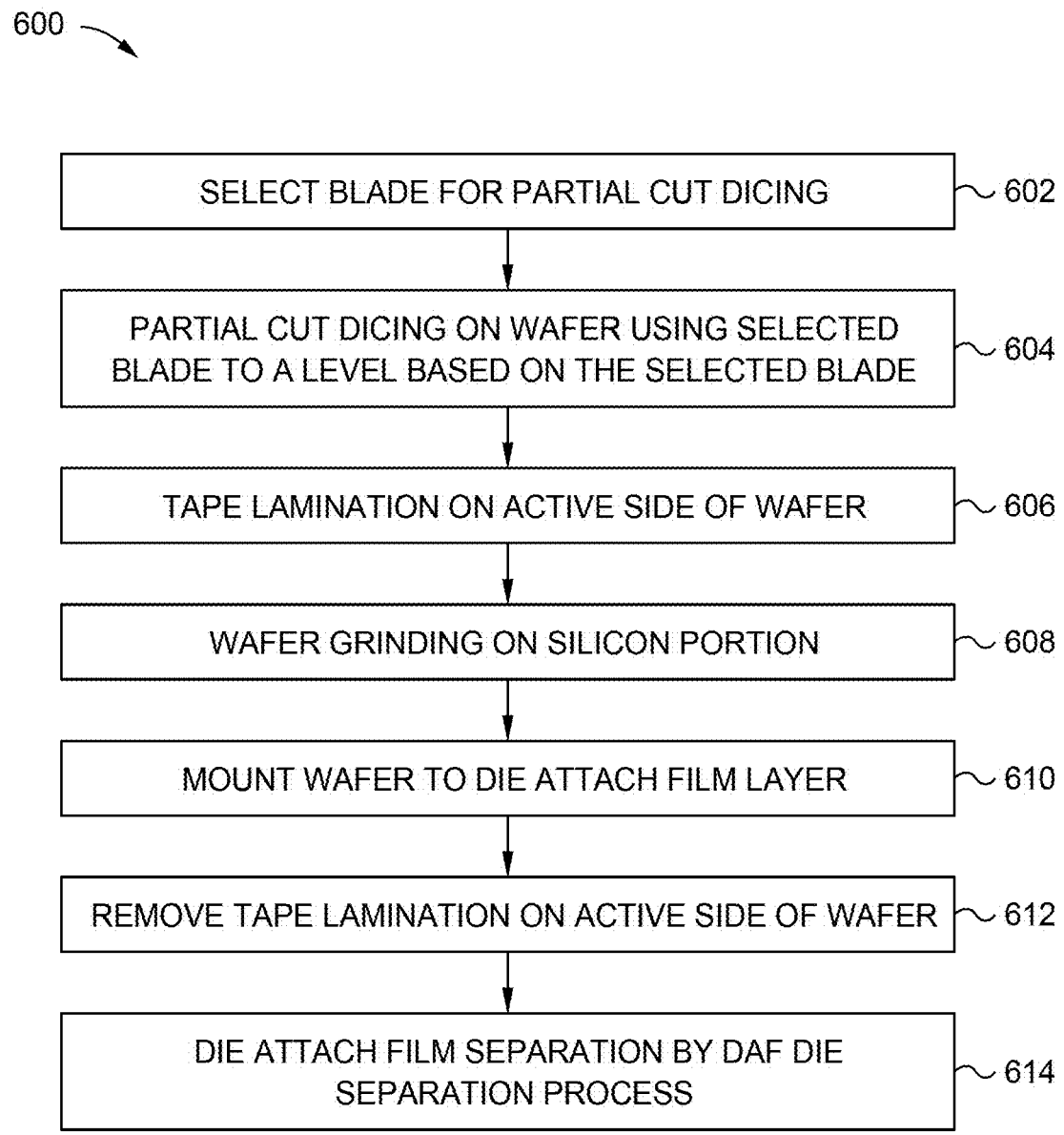
FIG. 6 is a flow diagram illustrating a method of forming a semiconductor die from a semiconductor wafer having a plurality of semiconductor dies, according to certain embodiments.

FIG. 6 is a flow diagram illustrating a method 600 of forming a semiconductor die, such as the semiconductor die 322a, 322b, 422a, 422b of FIGS. 3 and 4, from a semiconductor wafer, such as the semiconductor wafer 320, 420 of FIGS. 3 and 4, having a plurality of semiconductor dies, respectively, according to certain embodiments. Method 600 may be similar to methods 300, 400 of FIGS. 3 and 4. At block 602, a blade is selected for partial cut dicing on a semiconductor wafer. The blade may either have a rectangular cross-section or a diamond cross-section. At block 604, the selected blade is used to perform partial cut dicing on the semiconductor wafer to a first level that is based on the selected blade. The first level may differ between the selected blades. For example, the first level associated with the rectangular cross-section blade may be shallower than the first level associated with the diamond cross-section blade.

At block 606, a back grinding tape is applied to a front side (i.e., metal layer) of the semiconductor wafer. At block 608, the silicon layer is grinded by a process of DBG, where the silicon layer is grinded to a second level relative to the front side. When the selected blade has a rectangular cross-section, the first level and the second level may be different by about 10 μm, where the first level is shallower than the second level. However, when the selected blade has a diamond cross-section, the first level and the second level may be substantially equal to each other. At block 610, the silicon layer side of the semiconductor wafer is mounted to a DAF layer. At block 612, the back grinding tape is removed from the front side of the semiconductor wafer. At block 614, the DAF layer is separated using a DDS process. At least a portion of the silicon layer is substantially equal in width to the DAF layer. The at least a portion of the silicon layer is the portion of the silicon layer that is in contact with the DAF layer.

Because the width of the DAF layer and the width of the at least a portion of the silicon layer are substantially equal, the risk of die burr occurring may be reduced. Furthermore, because of the cutting of the semiconductor wafer occurs to the second level, a portion of silicon may be present between the DAF layer and a cavity formed by the cutting. Thus, the portion of silicon remaining may prevent or reduce the risk for die burrs or random fractures occurring due to the DDS process. Furthermore, because a DAF laser is not utilized in method 600, risk of DAF laser shift may be avoided.

FIGS. 7A and 7B are exemplary illustrations of a semiconductor die 700, 750 using method 600 of FIG. 6, according to certain embodiments. FIG. 7A illustrates a semiconductor die 700 separated from a semiconductor wafer having a plurality of semiconductor dies as using a rectangular cross-section blade with rounded edges. The semiconductor die 700 includes a DAF layer 708, a silicon layer 702, a metal layer 704, and plurality of spacers 706a, 706b. Because the semiconductor die 700 is separated from a semiconductor wafer having a plurality of semiconductor dies using a rectangular cross-section blade with rounded edges, a portion of the silicon layer may be curved.

A half-width of the blade is represented by "a", where "a" may be between about 10 μm and about 20 μm. Likewise, a depth of the partial cut dicing is represented by "b", where "b" may be dependent on a die thickness minus "c" (described below).

The semiconductor die 700 may have a thickness of between about 25 μm and about 61 μm. Furthermore, because the depth "b" is less the total depth of the metal layer 704 and the silicon layer 702 (i.e., "b"+"c"), a portion of the silicon layer 702 remains disposed on the DAF layer 708. The portion of the silicon layer 702 that remains has a thickness of "c" and a width of "e", where "c" is equal to about 10 μm. In other examples, "c" may be between about 5 μm and about 10 μm. Furthermore, the portion of the silicon layer 702 that is partial cut through has a width of "d", where "e" is substantially greater than "d". Likewise, the DAF layer 708 has a width of "f", where the width of "f" is substantially equal to "e". Thus, the surface of the silicon layer 702 interfacing the DAF layer 708 has the same width. In other words, width "e" and width "f" are substantially equal. The metal layer 704 has a width of "g", where the width of "g" is substantially equal to the width of "d". Thus, the surface of the silicon layer 702 interfacing the metal layer 704 has the same width. In other words, width "d" and width "g" are substantially equal. The previously listed values are not intended to be limiting, but to provide an example of a possible embodiment.

FIG. 7B illustrates a semiconductor die 750 separated from a semiconductor wafer having a plurality of semiconductor dies using a diamond cross-section blade. The semiconductor die 750 includes a DAF layer 758, a silicon layer 752, a metal layer 754, and plurality of spacers 756a, 756b. Because the semiconductor die 750 is separated from a semiconductor wafer having a plurality of semiconductor dies using a diamond cross-section blade, the metal layer 754 and the silicon layer 752 may be formed at an angle. For example, if the blade has an angle of about 30 degrees to the vertical, then the metal layer 754, and the silicon layer may before at an angle ($\Theta$) of about 30 degrees to the vertical. It is to be understood that the previously listed value is not intended to be limiting. For example, the blade may have an angle of between about 30 degrees and about 44.57 degrees relative to a vertical axis.

A half-width of the blade is represented by "p", where "p" may be between about 16.345 μm and about 25 μm. Likewise, a depth of the partial cut dicing is represented by a die thickness "i", where "i" may be between about 25 μm and about 61 μm.

The semiconductor die 750 may have a thickness of between about 25 μm and about 61 μm. Furthermore, because the depth "i" is equal the total depth of the metal layer 754 and the silicon layer 752, a portion of the silicon layer 752 remains disposed on the DAF layer 758, where the portion may be relatively small. The portion of the silicon layer 752 that remains disposed on the DAF layer 758 has a width of "j". Likewise, the DAF layer 758 has a width of "k", where the width of "k" is substantially equal to "j". Thus, the surface of the silicon layer 752 interfacing the DAF layer 758 has the same width. In other words, width "j" and width "k" are substantially equal. In other examples, "j" may be equal to a size of the semiconductor die "m" (described below), or when referring to FIG. 7A, "d", plus half of a saw street width (e.g., a width between adjacent semiconductor dies).

Furthermore, the portion of the silicon layer 752 that is partially cut through has a width of "m", where "j" is substantially greater than "m". The metal layer 754 has a first width of "n" and a second width of "o", where the first width of "n" is substantially equal to the width of "m" and the first width of "n" is substantially greater than the second width of "o". Thus, the surface of the silicon layer 752 interfacing the metal layer 754 has the same width. In other words, width "m" and width "n" are substantially equal. The previously listed values are not intended to be limiting, but to provide an example of a possible embodiment.

By selecting a depth based on a selected blade type to perform partial cut dicing on a semiconductor wafer, the semiconductor die may be separated from a semiconductor wafer having a plurality of semiconductor dies without having to perform DAF laser cutting, while reducing risk of DAF random fracturing as a result of the separation method.

In one embodiment, a method of separating a semiconductor die from a semiconductor wafer having a plurality of semiconductor dies, the method includes performing a partial cut on a front side of the semiconductor wafer to a first level of the semiconductor wafer to form a cavity, applying tape lamination on the front side of the semiconductor wafer, grinding a silicon layer on a back side of the semiconductor wafer, mounting the back side of the semiconductor wafer to a die attach film (DAF) layer, removing the tape lamination from the front side of the semiconductor wafer, and performing a DAF-die separation (DDS) process to separate the semiconductor die from an adjacent semiconductor die of the semiconductor wafer. Remnants of the DAF layer remain on a side edge of the semiconductor die. The side edge of the semiconductor die has a width that is greater than a remaining portion of the semiconductor die. A width of the remnants of the DAF layer is equal to the width of the side edge of the semiconductor die. The grinding is to a second level of the semiconductor wafer and the back side is opposite the front side.

A DAF laser is not applied to the semiconductor wafer during the method of separating the semiconductor die from the semiconductor wafer. The first level is substantially less than the second level when the cavity has a rectangular cross-section with rounded edges. A difference between the first level and the second level is about 10 µm. The first level and the second level are substantially equal when the cavity has a triangular cross-section. The DDS process occurs at a midpoint of the cavity at the first level. Remnants of the DAF layer remain on a side edge between the front side and the back side of the semiconductor die. At least a portion of a width of a remaining portion of the silicon layer is substantially equal to the DAF layer contacting the at least a portion of the width of the remaining portion of the silicon layer. Performing the DDS process is in response to removing the tape lamination.

In another embodiment, a semiconductor die structure formed by a method including a step for performing a partial cut on a front side of the semiconductor wafer to a first level of the semiconductor wafer to form a cavity, a step for applying tape lamination on a front side of the semiconductor wafer, a step for grinding a silicon layer on a back side of the semiconductor wafer, a step for mounting the back side of the semiconductor wafer to a die attach film (DAF) layer, a step for removing the tape lamination from the front side of the semiconductor wafer, and a step for performing DAF-die separation (DDS) to separate the semiconductor die from an adjacent semiconductor die of the plurality of semiconductor dies. The grinding is to a second level of the semiconductor wafer. The back side is opposite of the front side. The first level is substantially equal to or substantially less than the second level.

The step for performing DDS occurs in response to the step for removing the tape lamination from the front side of the semiconductor wafer. The method does not include a step for applying a DAF laser prior to the step for performing DDS. The cavity either has an angle of about 60 degrees from a surface the silicon layer contacting the DAF layer or is a rectangular cross-section with rounded edges. The separated semiconductor die has a width of the DAF layer that is substantially equal to at least portion of a width of the silicon layer. The separated semiconductor die has a thickness of between about 25 µm and about 61 µm. The formed semiconductor die structure includes a die attach film (DAF) layer and a silicon layer disposed adjacent to the DAF layer. A first side of the silicon layer is in contact with the DAF layer. Remnants of the DAF layer remain on a side edge of the semiconductor die. The side edge of the semiconductor die intersects the first side of the silicon layer.

In another embodiment, a semiconductor die structure separated from a semiconductor wafer having a plurality of semiconductor dies includes a die attach film (DAF) layer having a first width, a silicon layer disposed adjacent to the DAF layer, wherein a first side of the silicon layer is in contact with the DAF layer, and a metal layer disposed adjacent to the silicon layer. A second side of the silicon layer is in contact with the metal layer. The first side of the silicon layer and the second side of the silicon layer are opposite sides of the silicon layer. The silicon layer has at least a second width and a third width. The first width is substantially equal to the second width. The second width is substantially greater than the third width. The second width is a width of the first side of the silicon layer. The third width is a width of the second side of the silicon layer. Remnants of the DAF layer remain on a side edge of the semiconductor die. The side edge of the semiconductor die intersects the first side of the silicon layer and the second side of the silicon layer.

The silicon layer has an intermediate width. The intermediate width is less than or equal to the first width and greater than or equal to the third width. The intermediate width is a width that gradually changes from the first width to the third width. At least a portion of a third side of the silicon layer and at least a portion of a fourth side of the silicon layer is curved. The third side of the silicon layer and the fourth side of the silicon layer are opposite sides of the silicon layer. The third side of the silicon layer is coupled to a first corner of the first side of the silicon layer and a first corner of the second side of the silicon layer. The fourth side of the silicon layer is coupled to a second corner of the first side of the silicon layer and a second corner of the second side of the silicon layer. The first corner of the first side of the silicon layer is opposite of the second corner of the first side of the silicon layer. The first corner of the second side of the silicon layer is opposite of the second corner of the second side of the silicon layer. A height of the second width is equal to about 10 µm. The silicon layer further includes a third side and a fourth side. The third side of the silicon layer is coupled to a first corner of the first side of the silicon layer and a first corner of the second side of the silicon layer. The fourth side of the silicon layer is coupled to a second corner of the first side of the silicon layer and a second corner of the second side of the silicon layer. The first corner of the first side of the silicon layer is opposite of the second corner of the first side of the silicon layer. The first corner of the second side of the silicon layer is opposite of the second corner of the second side of the silicon layer. The third side of the silicon layer and the fourth side of the silicon layer are formed at between about a 67.72 degree angle and about a 75 degree angle from the first side.

While the foregoing is directed to embodiments of the present disclosure, other and further embodiments of the disclosure may be devised without departing from the basic scope thereof, and the scope thereof is determined by the claims that follow.

What is claimed is:

1. A method of separating a semiconductor die from a semiconductor wafer having a plurality of semiconductor dies, the method comprising:
    performing a partial cut on a front side of the semiconductor wafer to a first level relative to the front side of the semiconductor wafer to form a cavity;
    applying tape lamination over a metal layer exposed on the front side of the semiconductor wafer;
    grinding a portion of a silicon layer on a back side of the semiconductor wafer, wherein:
        the portion is grinded to a second level relative to the front side of the semiconductor wafer;
        a remaining portion of the silicon layer after the grinding has a thickness equal to a difference between the first level and the second level;
        the difference between the first level and the second level is about 10 µm; and
        the back side is opposite the front side;
    mounting the back side of the semiconductor wafer to a die attach film (DAF) layer;
    removing the tape lamination from the front side of the semiconductor wafer; and
    performing a DAF-die separation (DDS) process to separate the semiconductor die from an adjacent semiconductor die of the semiconductor wafer, wherein remnants of the DAF layer remain on a side edge of the semiconductor die, wherein the side edge of the semiconductor die has a width that is greater than a remaining portion of the semiconductor die, and wherein a width of the remnants of the DAF layer is equal to the width of the side edge of the semiconductor die.

2. The method of claim 1, wherein a DAF laser is not applied to the semiconductor wafer during the method of separating the semiconductor die from the semiconductor wafer.

3. The method of claim 1, wherein the first level is substantially less than the second level when the cavity has a rectangular cross-section with rounded edges.

4. The method of claim 1, wherein the DDS process occurs at a midpoint of the cavity at the first level.

5. The method of claim 1, wherein remnants of the DAF layer remain on a side edge between the front side and the back side of the semiconductor die.

6. The method of claim 1, wherein a width of the remaining portion of the silicon layer that contacts the DAF layer is equal to a greatest width of the DAF layer.

7. The method of claim 1, wherein performing the DDS process is in response to removing the tape lamination.

* * * * *